(12) United States Patent
Ker et al.

(10) Patent No.: US 8,379,354 B2
(45) Date of Patent: Feb. 19, 2013

(54) ESD PROTECTION CIRCUITRY WITH MULTI-FINGER SCRS

(75) Inventors: Ming-Dou Ker, Hsinchu County (TW); Chun-Yu Lin, Hualien (TW); Chang-Tzu Wang, Taipei (TW)

(73) Assignees: United Microelectronics Corp., Science-Based Industrial Park, Hsin-Chu (TW); National Chiao-Tung University, Hsinchu (TW)

( * ) Notice: Subject to any disclaimer, the term of this patent is extended or adjusted under 35 U.S.C. 154(b) by 293 days.

(21) Appl. No.: 12/269,860

(22) Filed: Nov. 12, 2008

(65) Prior Publication Data

US 2010/0118454 A1  May 13, 2010

(51) Int. Cl.
  *H02H 9/00* (2006.01)
(52) U.S. Cl. ......................................................... 361/56
(58) Field of Classification Search ...................... 361/56
  See application file for complete search history.

(56) References Cited

U.S. PATENT DOCUMENTS

| | | | | |
|---|---|---|---|---|
| 5,670,799 A * | 9/1997 | Croft | ............................. | 257/173 |
| 5,880,488 A | 3/1999 | Yu | | |
| 6,583,972 B2 | 6/2003 | Verhaege et al. | | |
| 6,621,126 B2 | 9/2003 | Russ | | |
| 6,858,901 B2 * | 2/2005 | Ker et al. | ....................... | 257/360 |
| 7,098,510 B2 * | 8/2006 | Kodama et al. | ................ | 257/355 |
| 7,224,560 B2 * | 5/2007 | May et al. | ......................... | 361/56 |
| 7,705,404 B2 * | 4/2010 | Ker et al. | ....................... | 257/360 |
| 2002/0033507 A1 | 3/2002 | Verhaege | | |
| 2002/0041007 A1 | 4/2002 | Russ | | |
| 2007/0002508 A1 * | 1/2007 | Vanysacker et al. | ............ | 361/56 |

* cited by examiner

*Primary Examiner* — Rexford N Barnie
*Assistant Examiner* — Ann Hoang
(74) *Attorney, Agent, or Firm* — Winston Hsu; Scott Margo (57) ABSTRACT

Self-triggered Multi-finger SCRs used in ESD protection circuitry capable of turning on all SCR fingers of the multi-finger SCRs include a first source, a second source, N SCR units, (N−1) diodes, and N resistors. Each of the N SCR units includes a first node, a second node coupled to the second source, and a trigger node. An nth diode of the (N−1) diodes is coupled between a first node of an nth SCR unit and a trigger node of an (n+1)th SCR unit. An nth resistor is coupled between the first node of the nth SCR unit and the first source, wherein n and N are integers. The (N−1) diodes can be replaced by directly coupled the first node of the nth SCR unit to the trigger node of the (n+1)th SCR unit when a trigger pulse is applied at the trigger node of a first SCR unit.

20 Claims, 7 Drawing Sheets

ESD PROTECTION CIRCUITRY WITH MULTI-FINGER SCRS

BACKGROUND OF THE INVENTION

1. Field of the Invention

The present invention relates to ESD protection circuitry with multi-finger SCRs, especially to ESD protection circuitry which can turn on all of its multi-finger SCRs.

2. Description of the Prior Art

The electrostatic discharge (ESD) is a sudden and momentary electric current generated by friction or induction and then flows through circuitry. It may cause damage to electronic equipment. Some circuitry and devices are vulnerable to ESD, for example MOSFETs (Metal Oxide Semiconductor Field Effect Transistor). Therefore, ESD protection circuitry is often applied in IC designs.

SUMMARY OF THE INVENTION

An embodiment of the present invention releases ESD protection circuitry with multi-finger SCRs, comprising a first source, a second source, N SCR units, (N−1) diodes, and N resistors. Each of the N SCR units includes a first node, a second node coupled to the second source, and a trigger node. An nth diode of the (N−1) diodes is coupled between a first node of an nth SCR unit and a trigger node of an (n+1)th SCR unit. An nth resistor is coupled between the first node of the nth SCR unit and the first source, wherein n and N are integers.

Another embodiment of the present invention releases ESD protection circuitry with multi-finger SCRs, comprising a first source, a second source, N SCR units, a first trigger input, and N resistors. Each of the N SCR units includes a first node, a second node coupled to the second source, and a trigger node, wherein a first node of an nth SCR unit of the N SCR units is coupled to a trigger node of an (n+1)th SCR unit of the N SCR units. The first trigger input is coupled to the trigger node of the first SCR unit of the N SCR units. An nth resistor is coupled between the first node of the nth SCR unit and the first source, wherein n and N are integers.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a domino-like, self-triggered design capable of turning on all SCR fingers in multi-finger SCRs used as ESD protection circuitry. Once an SCR finger in the multi-finger SCRs is turned on first, the present invention utilizes a diode or a trigger pulse to force some ESD current flowing through the first turned-on SCR finger to flow through an SCR next to it to turn on the next SCR finger. After the next SCR finger is turned on, some current flowing through it is forced by another diode, a trigger pulse inputted at the first SCR finger or at the present SCR finger itself to turn on an SCR finger next to it again. As a domino effect, all the SCR fingers in the multi-finger SCRs are turned on one after another. Thus, at least one SCR finger is turned on first, other SCR fingers in the multi-finger SCRs are triggered to be turned on subsequently. Even though all SCR fingers in the multi-finger SCRs can not be turned on at the same time, all SCR fingers can be turned on before any SCR finger is damaged. This is the self-triggered principle of the present invention.

Figure 1:
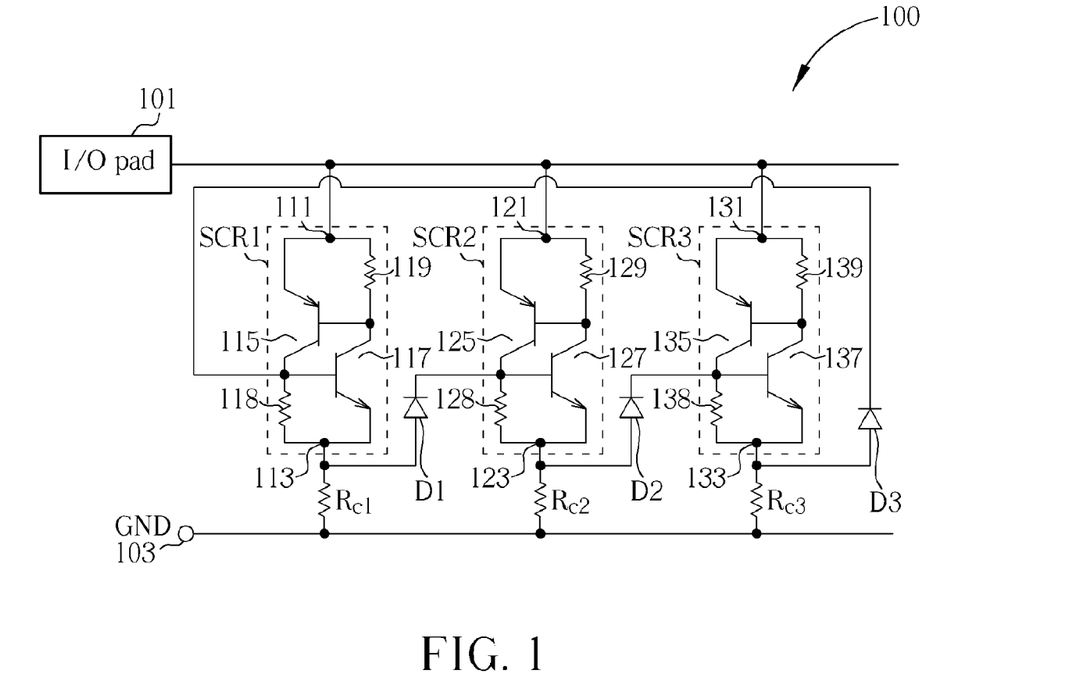
FIG. 1 is a schematic diagram of multi-finger SCRs of the first embodiment according to the present invention.

Please refer to FIG. 1. FIG. 1 is a schematic diagram of multi-finger SCRs 100 of the first embodiment according to the present invention. The multi-finger SCRs 100 include an I/O pad line 101, a ground line 103, 3 SCR fingers, SCR1, SCR2, and SCR3, 3 diodes, D1, D2, and D3, and 3 resistors, Rc1, Rc2, and Rc3. The SCR1 includes a first node 111 coupled to the I/O pad line 101, and a second node 113 coupled to a positive node of the diode D1. The SCR1 further includes a PNP BJT 115, an NPN BJT 117, and 2 resistors 118 and 119. The PNP BJT 115 includes an emitter coupled to the first node 111 and the resistor 119, a base coupled to the resistor 119, and a collector coupled to the resistor 118. The NPN BJT 117 includes an emitter coupled to the second node 113 and the resistor 118, a base coupled to the resistor 118 and the collector of the PNP BJT 115, and a collector coupled to the base of the PNP BJT 115 and the resistor 119. The resistor Rc1 is coupled between the ground line 103 and the second node 113 of the SCR finger SCR1. The diode D3 includes a negative node coupled to the base of the NPN BJT 117. The SCR2 includes a first node 121 coupled to the I/O pad line 101, and a second node 123 coupled to a positive node of the diode D2. The SCR2 further includes a PNP BJT 125, an NPN BJT 127, and 2 resistors 128 and 129. The PNP BJT 125 includes an emitter coupled to the first node 121 and the resistor 129, a base coupled to the resistor 129, and a collector coupled to the resistor 128. The NPN BJT 127 includes an emitter coupled to the second node 123 and the resistor 128, a base coupled to the resistor 128, and the collector of the PNP BJT 125, and a collector coupled to the base of the PNP BJT 125 and the resistor 129. The resistor Rc2 is coupled between the ground line 103 and the second node 123 of the SCR finger SCR2. The diode D1 includes a negative node coupled to the base of the NPN BJT 127. The SCR3 includes a first node 131 coupled to the I/O pad line 101, and a second node 133 coupled to a positive node of the diode D3. The SCR3 further includes a PNP BJT 135, an NPN BJT 137, and 2 resistors 138 and 139. The PNP BJT 135 includes an emitter coupled to the first node 131 and the resistor 139, a base coupled to the resistor 139, and a collector coupled to the resistor 138. The NPN BJT 137 includes an emitter coupled to the second node 133 and the resistor 138, a base coupled to the resistor 138 and the collector of the PNP BJT 135, and a collector coupled to the base of the PNP BJT 135 and the resistor 139. The resistor Rc3 is coupled between the ground line 103 and the second node 133 of the SCR finger SCR3. The diode D2 includes a negative node coupled to the base of the NPN BJT 137. Please note that the number of the SCR fingers 3 given in the first embodiment is not meant to limit to the number of SCR fingers of the present invention, any integer number of the SCR fingers greater than 1 can be applied as well in the present embodiment.

Figure 2:
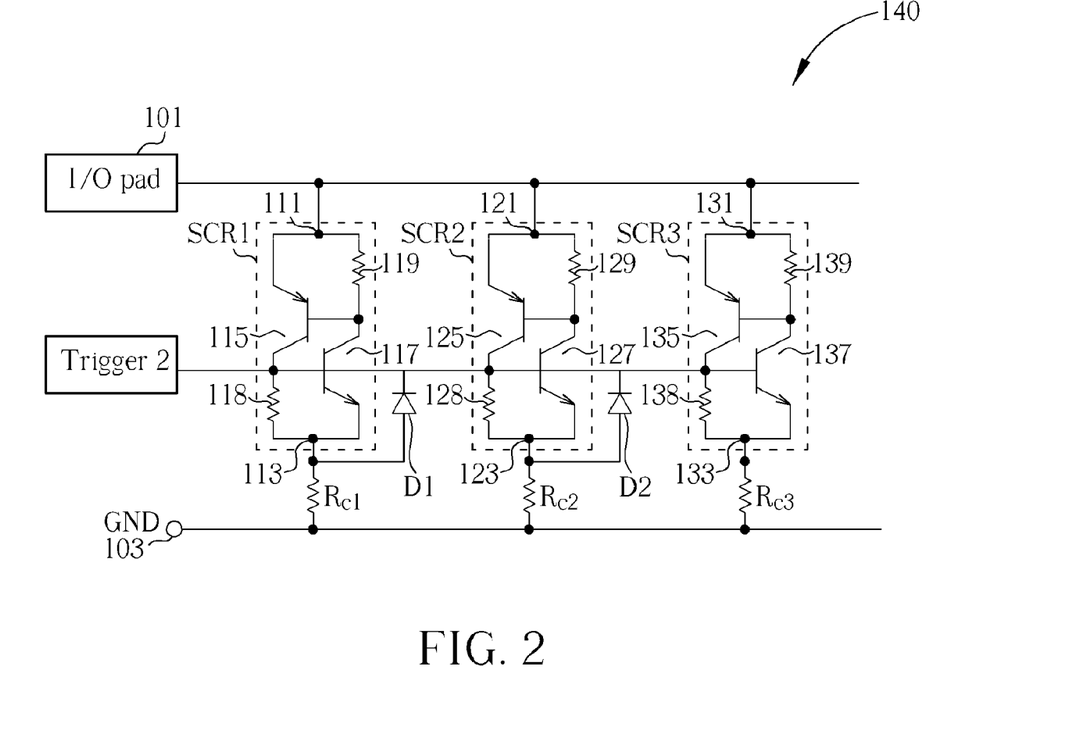
FIG. 2 is a schematic diagram of multi-finger SCRs in FIG. 1 with an external trigger input inputted at the base of each NPN BJT according to the second embodiment of the present invention.
Figure 3:
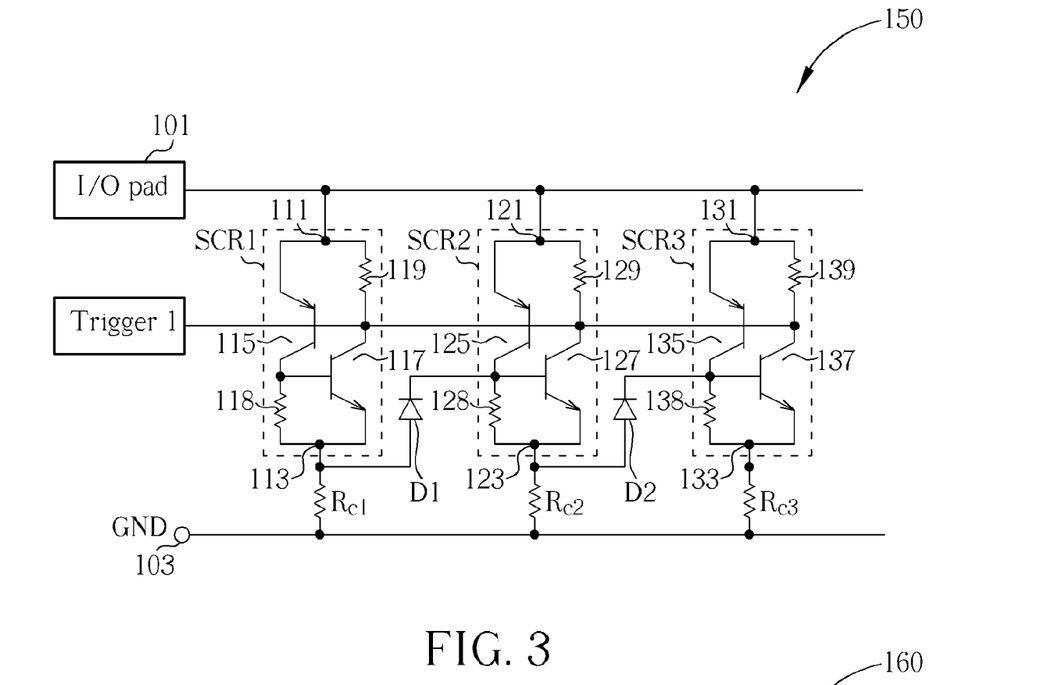
FIG. 3 is a schematic diagram of multi-finger SCRs in FIG. 1 with an external trigger input inputted at the base of each PNP BJT according to the third embodiment of the present invention.
Figure 4:
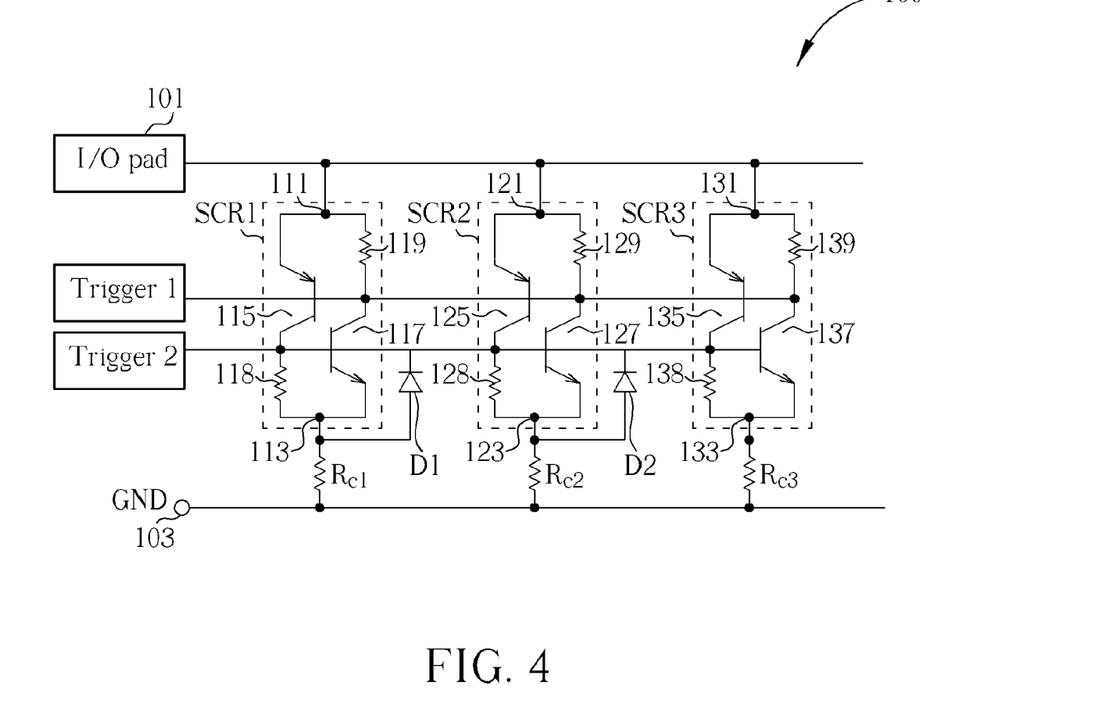
FIG. 4 is a schematic diagram of multi-finger SCRs in FIG. 1 with 2 external trigger inputs inputted at the base of each NPN BJT and the base of each PNP BJT according to the fourth embodiment of the present invention.
Figure 5:
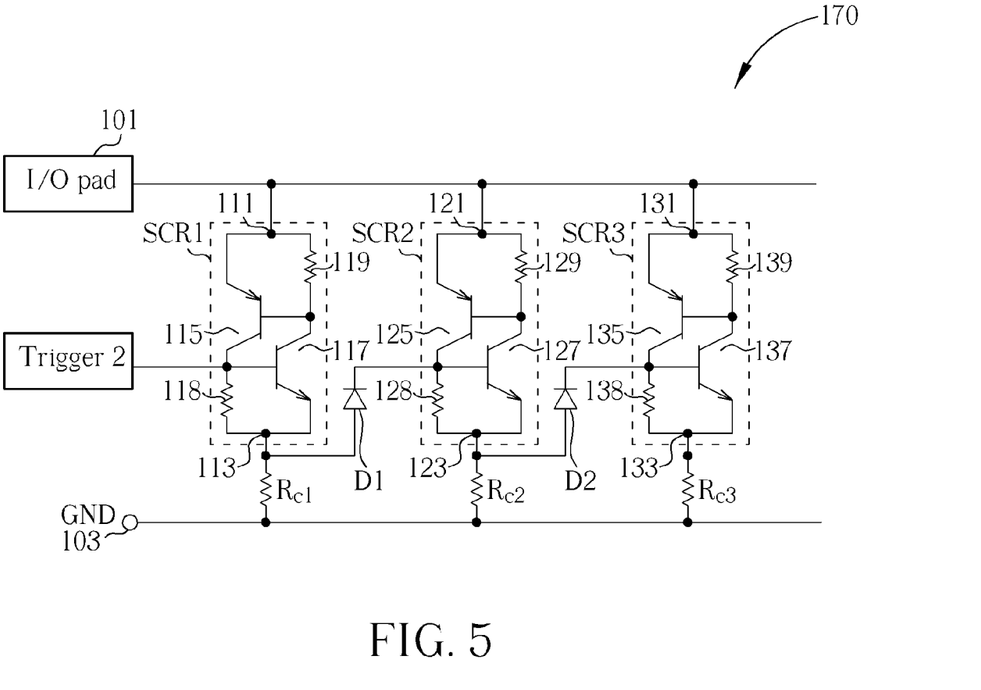
FIG. 5 is a schematic diagram of multi-finger SCRs in FIG. 1 with an external trigger input inputted at the base of the NPN BJT of the first SCR finger according to the fifth embodiment of the present invention.
Figure 6:
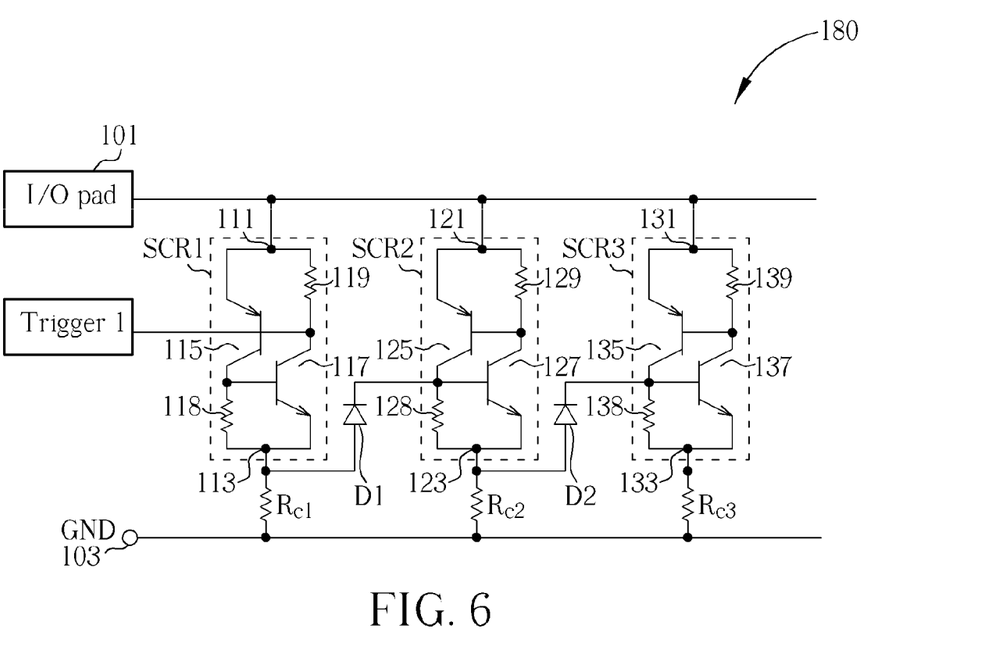
FIG. 6 is a schematic diagram of multi-finger SCRs in FIG. 1 with an external trigger input inputted at the base of the PNP BJT of the first SCR finger according to the sixth embodiment of the present invention.
Figure 7:
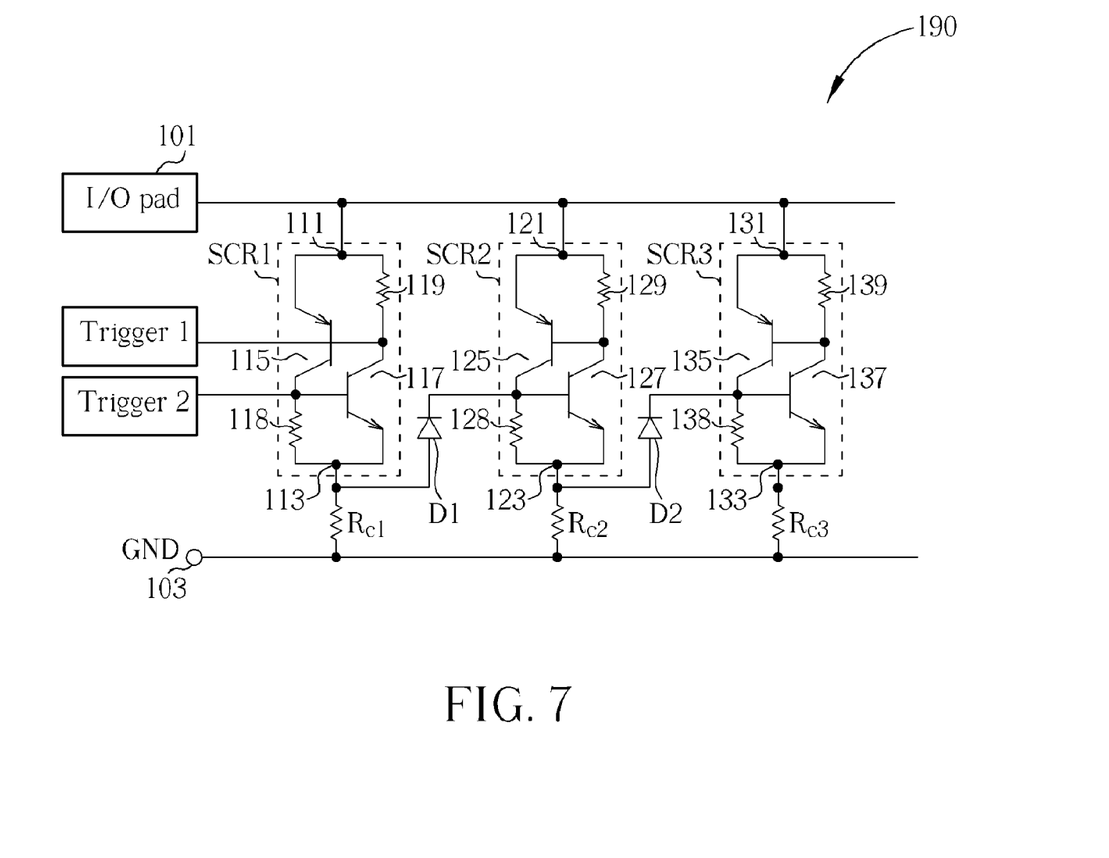
FIG. 7 is a schematic diagram of multi-finger SCRs in FIG. 1 with 2 external trigger inputs inputted at the bases of the NPN BJT and the PNP BJT of the first SCR finger according to the seventh embodiment of the present invention.

Moreover, a first trigger pulse can be inputted selectively at the bases of the PNP BJTs 115, 125, and 135, or only at the base of the PNP BJT 115 to give an external trigger pulse for turning on the SCR fingers more rapidly and effectively in the first embodiment. Or a second trigger can be inputted selectively at the bases of the NPN BJTs 117,127, and 137, or only at the base of the NPN BJT 117 for the same cause. Or both the first and second trigger pulses can be inputted together at the base of each PNP BJT and the base of each NPN BJT, or only at the bases of the PNP BJT 115 and NPN BJT 117. When a trigger, or two triggers are applied to the SCR finger SCR1, or each SCR finger respectively, the diode (in the first embodiment, it refers to the diode D3) coupled between the last SCR finger (in the first embodiment, the last SCR finger refers to the SCR finger SCR3) and the first SCR finger (in the first embodiment, the first SCR finger refers to the SCR finger SCR1) can be omitted for the first SCR finger has already been triggered by the trigger pulse, and is definitely to be turned on. Please refer to FIGS. 2, 3, 4, 5, 6, and 7 together. FIG. 2 shows a schematic diagram of multi-finger SCRs 140 in FIG. 1 with an external second trigger input inputted at the base of each NPN BJT according to the second embodiment of the present invention. FIG. 3 shows a schematic diagram of multi-finger SCRs 150 in FIG. 1 with an external first trigger input inputted at the base of each PNP BJT according to the third embodiment of the present invention. FIG. 4 shows a schematic diagram of multi-finger SCRs 160 in FIG. 1 with external first and second trigger inputs inputted at the base of each NPN BJT and the base of each PNP BJT according to the fourth embodiment of the present invention. FIG. 5 shows a schematic diagram of multi-finger SCRs 170 in FIG. 1 with an external second trigger input inputted at the base of the NPN BJT 117 of the first SCR finger SCR1 according to the fifth embodiment of the present invention. FIG. 6 shows a schematic diagram of multi-finger SCRs 180 in FIG. 1 with an external first trigger input inputted at the base of the PNP BJT 115 of the first SCR finger SCR1 according to the sixth embodiment of the present invention. FIG. 7 shows a schematic diagram of multi-finger SCRs 190 in FIG. 1 with external first and second trigger inputs inputted at the bases of the NPN BJT 117 and the PNP BJT 115 of the first SCR finger SCR1 according to the seventh embodiment of the present invention.

In the above embodiments, the diode of the present invention has a negative node coupled to a base of an NPN BJT of an SCR finger, and a positive node coupled to an emitter of an NPN BJT of a former SCR finger connected to the SCR finger in parallel. However, the present invention is not confined to this connection only. The diode of the present invention may have the positive node coupled to a base of a PNP BJT of an SCR finger, and the negative node coupled to an emitter of a PNP BJT of a former SCR finger connected to the SCR finger in parallel. In this case, the resistor connected to the SCR finger in series is coupled between the I/O pad line 101 and the first node of the SCR finger. Of course, in this case, a first trigger pulse can be inputted selectively at the bases of all the PNP BJTs, or only at the base of the first PNP BJT to give an external trigger pulse for turning on the SCR fingers more rapidly and effectively. Or a second trigger can be inputted selectively at the bases of all the NPN BJTs, or only at the base of the first NPN BJT for the same cause. Or both the first and second trigger pulses can be inputted together at the base of each PNP BJT and the base of each NPN BJT, or only at the bases of the first PNP BJT and NPN BJT. When a trigger, or two triggers are applied to the first SCR finger, or each SCR finger respectively, the diode coupled between the last SCR finger and the first SCR finger can be omitted for the first SCR finger has already been triggered by the trigger pulse, and is definitely to be turned on.

Moreover, the diode of the present invention may have the positive node coupled to a base of a PNP BJT of an SCR finger, and the negative node coupled to an emitter of a PNP BJT of a former SCR finger connected to the SCR finger in parallel, and the resistor connected to the former SCR finger in series is coupled between the I/O pad line 101 and the first node of the former SCR finger; the latter diode may have a negative node coupled to a base of an NPN BJT of a latter SCR finger connected to the SCR finger in parallel, and a positive node coupled to an emitter of the NPN BJT of the SCR finger, and the resistor connected to the SCR finger in series is coupled between the ground line 103 and the second node of the SCR finger. In this case, a first trigger pulse also can be inputted selectively at the bases of all the PNP BJTs, or only at the base of the first PNP BJT to give an external trigger pulse for turning on the SCR fingers more rapidly and effectively. Or a second trigger can be inputted selectively at the bases of all the NPN BJTs, or only at the base of the first NPN BJT for the same cause. Or both the first and second trigger pulses can be inputted together at the base of each PNP BJT and the base of each NPN BJT, or only at the bases of the first PNP BJT and NPN BJT. When a trigger, or two triggers are applied to the first SCR finger, or each SCR finger respectively, the diode coupled between the last SCR finger and the first SCR finger can be omitted for the first SCR finger has already been triggered by the trigger pulse, and is definitely to be turned on.

Figure 8:
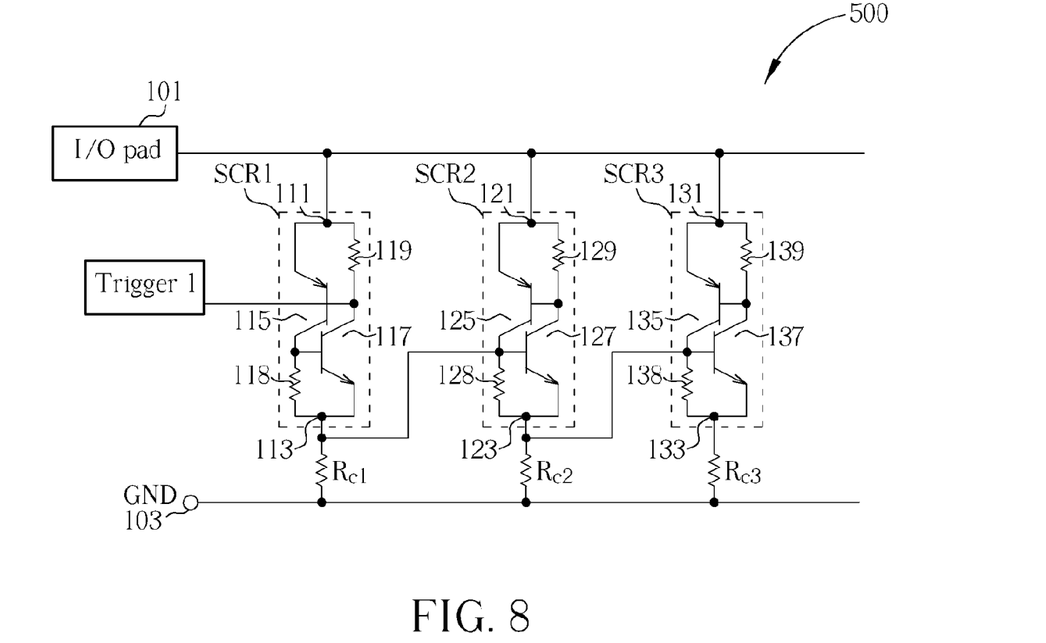
FIG. 8 is a schematic diagram of multi-finger SCRs of the eighth embodiment according to the present invention.

A eighth embodiment is given in FIG. 8 to further illustrate the purpose of the present invention. Please refer to FIG. 8.

FIG. 8 is a schematic diagram of multi-finger SCRs 500 of the eighth embodiment according to the present invention. The multi-finger SCRs 500 include an I/O pad line 101, a ground line 103, 3 SCR fingers, SCR1, SCR2, and SCR3, 3 resistors, Rc1, Rc2, and Rc3, and a first trigger input. The SCR1 includes a PNP BJT 115, an NPN BJT 117, and 2 resistors 118 and 119. The connections of the PNP BJT 115, the NPN BJT 117, and the 2 resistors 118 and 119 are substantially similar to the connections in the first embodiment, therefore the description is omitted here for the sake of brevity. The resistor Rc1 is coupled between the ground line 103 and a second node 113 of the SCR finger SCR1. The first trigger input is coupled to the base of the PNP BJT 115 of the first SCR finger SCR1. The SCR2 includes a PNP BJT 125, an NPN BJT 127, and 2 resistors 128 and 129. The connections of the PNP BJT 125, the NPN BJT 127, and the 2 resistors 128 and 129 are substantially similar to the connections in the first embodiment, therefore the description is omitted here for the sake of brevity. The resistor Rc2 is coupled between the ground line 103 and a second node 123 of the SCR finger SCR2. The SCR3 includes a first node 131 coupled to the I/O pad line 101. The SCR3 further includes a PNP BJT 135, an NPN BJT 137, and 2 resistors 138 and 139. The connections of the PNP BJT 135, the NPN BJT 137, and the 2 resistors 138 and 139 are substantially similar to the connections in the first embodiment, therefore the description is omitted here for the sake of brevity. The resistor Rc3 is coupled between the ground line 103 and a second node 133 of the SCR finger SCR3. The SCR1 further includes a first node 111 coupled to the I/O pad line 101, and a second node 113 coupled to a base node of the NPN BJT 127. The SCR2 further includes a first node 121 coupled to the I/O pad line 101, and a second node 123 coupled to a base node of the NPN BJT 137. Please note that the number of the SCR fingers 3 given in the eighth embodiment is not meant to limit to the number of SCR fingers of the present invention, any integer number of the SCR fingers greater than 1 can be applied as well in the present embodiment.

Figure 9:
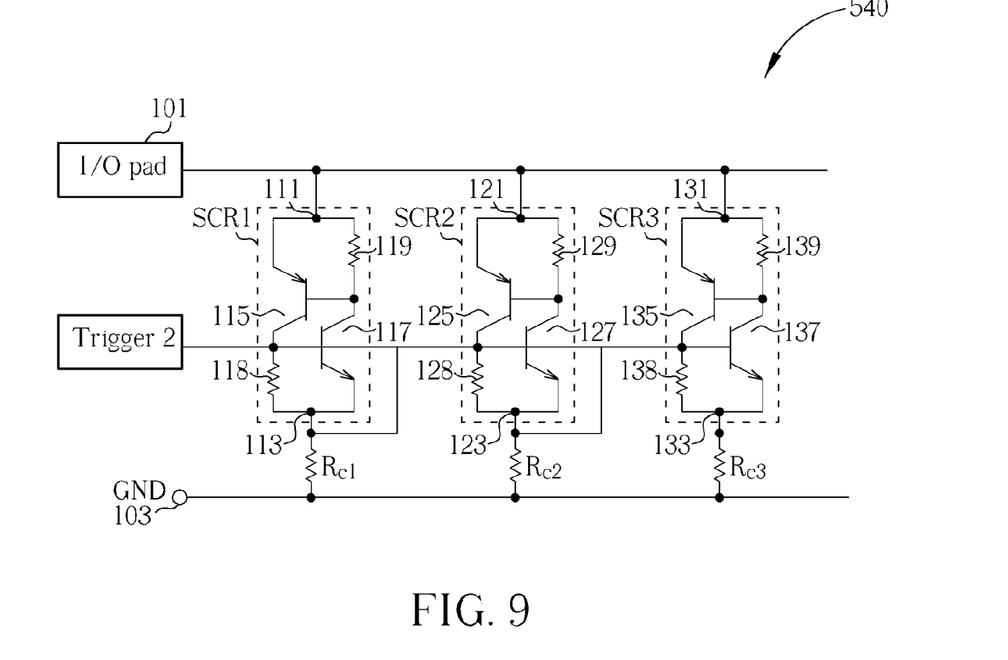
FIG. 9 is a schematic diagram of multi-finger SCRs in FIG. 8 with an external trigger input inputted at the base of each NPN BJT according to the ninth embodiment of the present invention.
Figure 10:
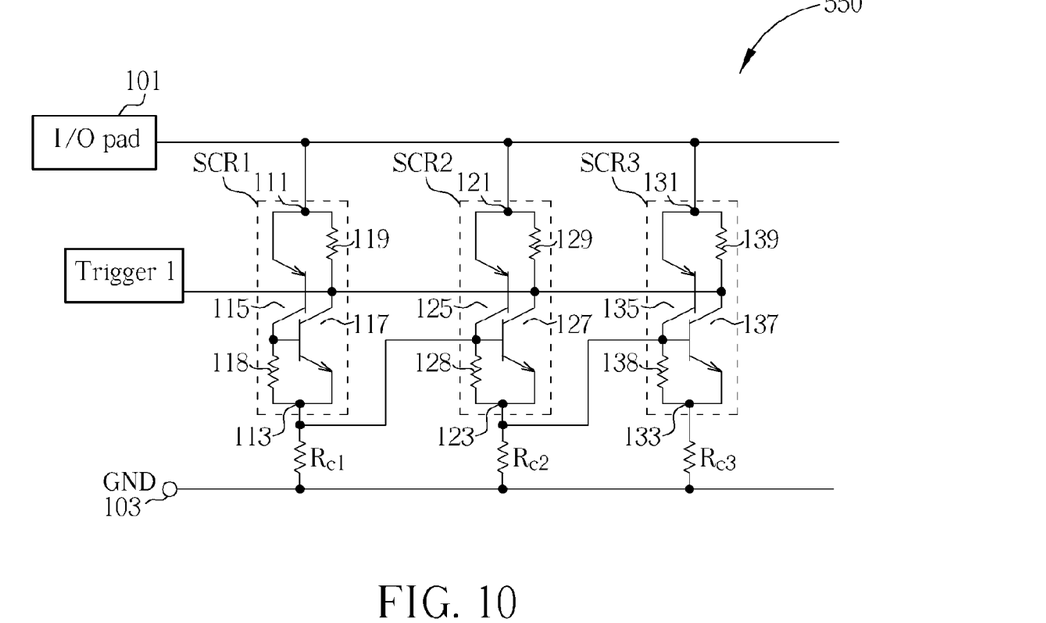
FIG. 10 is a schematic diagram of multi-finger SCRs in FIG. 8 with an external trigger input inputted at the base of each PNP BJT according to the tenth embodiment of the present invention.
Figure 11:
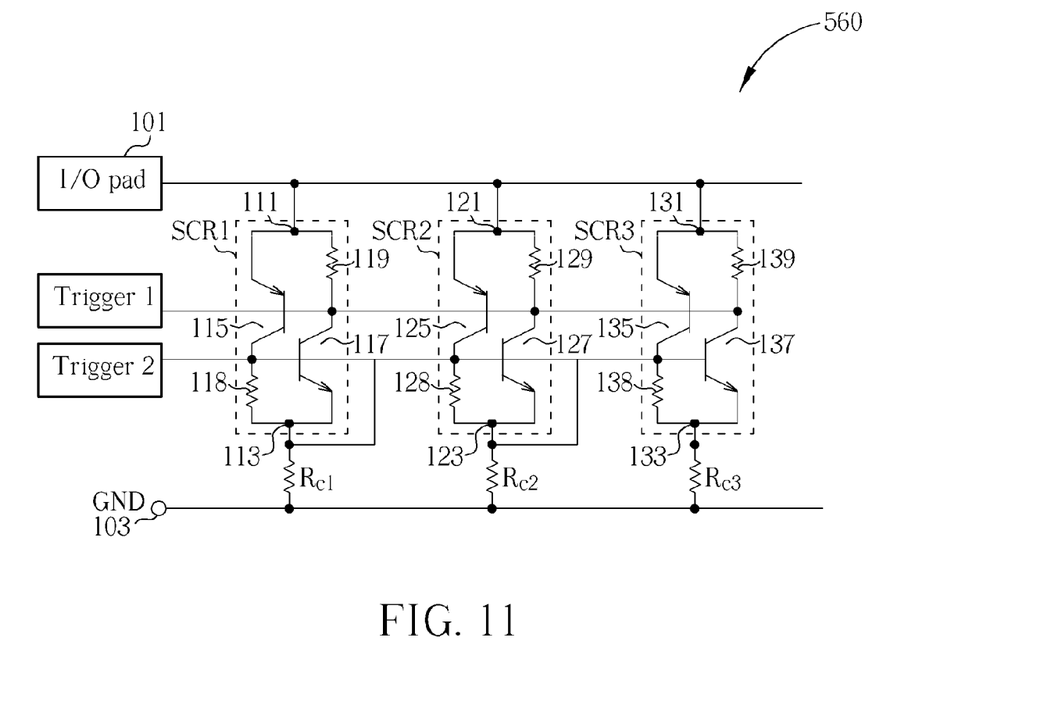
FIG. 11 is a schematic diagram of multi-finger SCRs in FIG. 8 with 2 external trigger inputs inputted at the base of each NPN BJT and the base of each PNP BJT according to the eleventh embodiment of the present invention.
Figure 12:
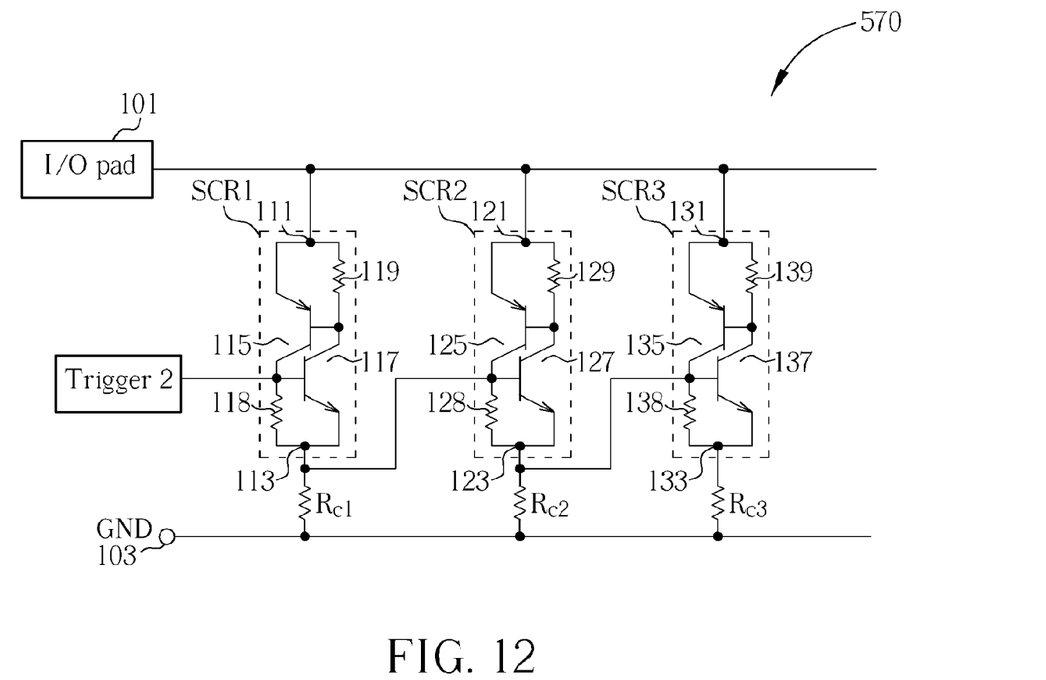
FIG. 12 is a schematic diagram of multi-finger SCRs in FIG. 8 with an external trigger input inputted at the base of the NPN BJT of the first SCR finger according to the twelfth embodiment of the present invention.
Figure 13:
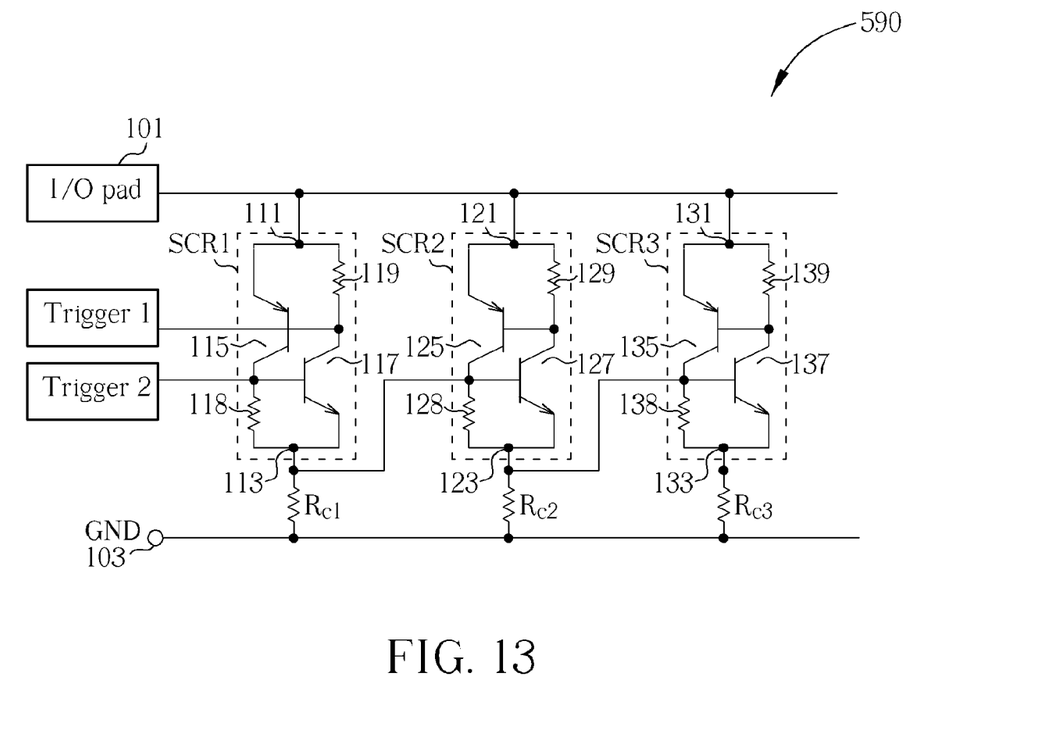
FIG. 13 is a schematic diagram of multi-finger SCRs in FIG. 8 with 2 external trigger inputs inputted at the bases of the NPN BJT and the PNP BJT of the first SCR finger according to the thirteenth embodiment of the present invention.

Moreover, a first trigger pulse can be inputted selectively at the bases of the PNP BJTs 115, 125, and 135 to give an external trigger pulse for turning on the SCR fingers more rapidly and effectively in the eighth embodiment. Or a second trigger can be inputted selectively at the bases of the NPN BJTs 117, 127, and 137, or only at the base of the NPN BJT 117 for the same cause. Or both the first and second trigger pulses can be inputted together at the base of each PNP BJT and the base of each NPN BJT, or only at the bases of the PNP BJT 115 and NPN BJT 117. When a trigger, or two triggers are applied to the SCR finger SCR1, or each SCR finger respectively, the second node of the last SCR finger (in the eighth embodiment, the last SCR finger refers to the SCR finger SCR3, and the second node of the last SCR finger refers to the second node 133) doesn't need to be coupled to the base of the NPN BJT of the first SCR finger (in the eighth embodiment, the first SCR finger refers to the SCR finger SCR1, and the NPN BJT of the first SCR finger refers to the NPN BJT 117) for the first SCR finger has already been triggered by the trigger pulse, and is definitely to be turned on. Please refer to FIGS. 9, 10, 11, 12, and 13 together. FIG. 9 shows a schematic diagram of multi-finger SCRs 540 in FIG. 8 with an external second trigger input inputted at the base of each NPN BJT according to the ninth embodiment of the present invention. FIG. 10 shows a schematic diagram of multi-finger SCRs 550 in FIG. 8 with an external first trigger input inputted at the base of each PNP BJT according to the tenth embodiment of the present invention. FIG. 11 shows a schematic diagram of multi-finger SCRs 560 in FIG. 8 with external first and second trigger inputs inputted at the base of each NPN BJT and the base of each PNP BJT according to the eleventh embodiment of the present invention. FIG. 12 shows a schematic diagram of multi-finger SCRs 570 in FIG. 8 with an external second trigger input inputted at the base of the NPN BJT 117 of the first SCR finger SCR1 according to the twelfth embodiment of the present invention. FIG. 13 shows a schematic diagram of multi-finger SCRs 590 in FIG. 8 with external first and second trigger inputs inputted at the bases of the NPN BJT 117 and the PNP BJT 115 of the first SCR finger SCR1 according to the thirteenth embodiment of the present invention.

In the above embodiments, a base of an NPN BJT of an SCR finger is coupled to an emitter of an NPN BJT of a former SCR finger connected to the SCR finger in parallel. However, the present invention is not confined to this connection only. A base of a PNP BJT of an SCR finger may be coupled to an emitter of a PNP BJT of a former SCR finger connected to the SCR finger in parallel. In this case, the resistor connected to the SCR finger in series is coupled between the I/O pad line 101 and the first node of the SCR finger. Of course, in this case, a first trigger pulse can be inputted selectively at the bases of all the PNP BJTs, or only at the base of the first PNP BJT to give an external trigger pulse for turning on the SCR fingers more rapidly and effectively. Or a second trigger can be inputted selectively at the bases of all the NPN BJTs, or only at the base of the first NPN BJT for the same cause. Or both the first and second trigger pulses can be inputted together at the base of each PNP BJT and the base of each NPN BJT, or only at the bases of the first PNP BJT and NPN BJT. When a trigger, or two triggers are applied to the first SCR finger, or each SCR finger respectively, the last SCR finger doesn't need to be connected back to the first SCR finger for the first SCR finger has already been triggered by the trigger pulse, and is definitely to be turned on.

Moreover, a base of a PNP BJT of an SCR finger of the present invention may be coupled to an emitter of a PNP BJT of a former SCR finger connected to the SCR finger in parallel, and the resistor connected to the former SCR finger in series is coupled between the I/O pad line 101 and the first node of the former SCR finger; a base of an NPN BJT of a latter SCR finger connected to the SCR finger in parallel may be coupled to an emitter of the NPN BJT of the SCR finger, and the resistor connected to the SCR finger in series is coupled between the ground line 103 and the second node of the SCR finger. In this case, a first trigger pulse also can be inputted selectively at the bases of all the PNP BJTs, or only at the base of the first PNP BJT to give an external trigger pulse for turning on the SCR fingers more rapidly and effectively. Or a second trigger can be inputted selectively at the bases of all the NPN BJTs, or only at the base of the first NPN BJT for the same cause. Or both the first and second trigger pulses can be inputted together at the base of each PNP BJT and the base of each NPN BJT, or only at the bases of the first PNP BJT and NPN BJT. When a trigger, or two triggers are applied to the first SCR finger, or each SCR finger respectively, the last SCR finger doesn't need to be connected back to the first SCR finger for the first SCR finger has already been triggered by the trigger pulse, and is definitely to be turned on.

The present invention utilizes multi-finger SCRs instead of multi-finger MOSFETs because the SCRs have the following advantages:

a smaller area: the holding voltage of a MOSFET is around 4~5V, however, although an SCR needs a trigger to turn it on, the holding voltage of an SCR is only around 1V. Therefore, with the same ESD current, an SCR needs a smaller size to discharge it than a MOSFET does.

2. without a gate: a gate part of a MOSFET is the easiest part to be punched through by currents, and an SCR doesn't include a gate part. Hence, an SCR is more difficult to be punched through by ESD currents when compared with a MOSFET.

3. a higher withstanding voltage: an SCR can stand a higher ESD voltage when compared with a MOSFET.

The present invention utilizes a domino-like, self-triggered design capable of turning on all SCR fingers in multi-finger SCRs used as ESD protection circuitry. The SCR is superior to the MOSFET due to its smaller area, a higher withstanding voltage, and no gate structure as used in ESD protection circuitry. As a result, the present invention can provide an effective, lasting ESD protection circuitry by using the domino-like, self-triggered multi-finger SCRs.

Those skilled in the art will readily observe that numerous modifications and alterations of the device and method may be made while retaining the teachings of the invention.

What is claimed is:

1. ESD (Electrostatic Discharge) protection circuitry with multi-finger SCRs (Silicon-Controlled Rectifier), comprising:
   a first source; and
   N SCR units, each of the N SCR units including:
      the first source, a trigger node, a first resistor, a first node, a second resistor, and ground serially coupled; and
      (N−1) diodes, an nth diode of the (N−1) diodes being coupled from a first node of an nth SCR unit to only a trigger node of an (n+1)th SCR unit;
   wherein n and N are integers.

2. The ESD protection circuitry of claim 1 wherein:
   the first source is an I/O pad;
   the nth diode of the (N−1) diodes includes a negative node coupled to the first node of the nth SCR unit, and a positive node coupled to the trigger node of the (n+1)th SCR unit; and
   each SCR unit further includes:
      a third resistor with a first end coupled to the first source;
      an NPN BJT (Bipolar Junction Transistor) including an emitter coupled to the first node of the SCR unit, a collector coupled to a second end of the third resistor of the SCR unit, and a base coupled to the trigger node of the SCR unit; and
      a PNP BJT including an emitter coupled to the first end of the third resistor of the SCR unit, a collector coupled to the trigger node of the SCR unit, and a base coupled to the collector of the NPN BJT of the SCR unit;
      wherein the first resistor is coupled between the emitter and the base of the NPN BJT and the third resistor is coupled between the base and the emitter of the PNP BJT of the SCR unit.

3. The ESD protection circuitry of claim 2 further comprising a first trigger pulse input coupled to the base of each PNP BJT.

4. The ESD protection circuitry of claim 3 further comprising a second trigger pulse input coupled to the base of each NPN BJT.

5. The ESD protection circuitry of claim 2 further comprising a first trigger pulse input coupled to the base of each NPN BJT.

6. The ESD protection circuitry of claim 2 further comprising a first trigger pulse input coupled to a base of a PNP BJT of a first SCR unit.

7. The ESD protection circuitry of claim 6 further comprising a second trigger pulse input coupled to a base of an NPN BJT of the first SCR unit.

8. The ESD protection circuitry of claim 2 further comprising a trigger pulse input coupled to a base of an NPN BJT of a first SCR unit.

9. The ESD protection circuitry of claim 2 wherein an Nth diode includes an anode coupled to a first node of an Nth SCR unit, and a cathode coupled to a trigger node of a first SCR unit.

10. ESD protection circuitry with multi-finger SCRs, comprising:
    a first source;
    N SCR units, each of the N SCR units including:
       the first source, a trigger node, a first resistor, a first node, a second resistor, and ground serially coupled; and
       (N−1) diodes, an nth diode of the (N−1) diodes being coupled from a first node of an nth SCR unit to only a trigger node of an (n+1)th SCR unit; and
    a first trigger input coupled to a trigger node of a first SCR unit of the N SCR units;
    wherein n and N are integers.

11. The ESD protection circuitry of claim 10 wherein the first trigger input is coupled to the trigger node of each SCR unit.

12. The ESD protection circuitry of claim 10 wherein:
    the first source is an I/O pad; and
    each SCR unit further includes:
       a third resistor with a first end coupled to the first source;
       an NPN BJT (Bipolar Junction Transistor) including an emitter coupled to the first node of the SCR unit, a collector coupled to a second end of the third resistor of the SCR unit, and a base coupled to the trigger node of the SCR unit; and
       a PNP BJT including an emitter coupled to the first end of the third resistor of the SCR unit, a collector coupled to the trigger node of the SCR unit, and a base coupled to the collector of the NPN BJT of the SCR unit;
       wherein the first resistor is coupled between the emitter and the base of the NPN BJT and the third resistor is coupled between the base and the emitter of the PNP BJT of the SCR unit.

13. The ESD protection circuitry of claim 12 further comprising a second trigger input coupled to a base of an NPN BJT of the first SCR unit.

14. The ESD protection circuitry of claim 12 further comprising a second trigger input coupled to a base of each NPN BJT.

15. ESD (Electrostatic Discharge) protection circuitry with multi-finger SCRs (Silicon-Controlled Rectifier), comprising:
    a first source; and
    N SCR units, each of the N SCR units including:
       the first source coupled to a trigger node, the trigger node directly coupled to a first resistor, the first resistor directly coupled to a first node, the first node directly coupled to a second resistor, and the second resistor directly coupled to ground; and
       (N−1) diodes, an nth diode of the (N−1) diodes being coupled between a first node of an nth SCR unit to only a trigger node of an (n+1)th SCR unit;
    wherein n and N are integers.

16. The ESD protection circuitry of claim 15 wherein:
    the first source is an I/O pad;
    the nth diode of the (N−1) diodes includes a negative node coupled to the first node of the nth SCR unit, and a positive node coupled to the trigger node of the (n+1)th SCR unit; and
    each SCR unit further includes:

a third resistor with a first end coupled to the first source;

an NPN BJT (Bipolar Junction Transistor) including an emitter coupled to the first node of the SCR unit, a collector coupled to a second end of the third resistor of the SCR unit, and a base coupled to the trigger node of the SCR unit; and a PNP BJT including an emitter coupled to the first end of the third resistor of the SCR unit, a collector coupled to the trigger node of the SCR unit, and a base coupled to the collector of the NPN BJT of the SCR unit;

wherein the first resistor is coupled between the emitter and the base of the NPN BJT and the third resistor is coupled between the base and the emitter of the PNP BJT of the SCR unit.

17. The ESD protection circuitry of claim 16 further comprising a first trigger pulse input coupled to the base of each PNP BJT.

18. The ESD protection circuitry of claim 17 further comprising a second trigger pulse input coupled to the base of each NPN BJT.

19. The ESD protection circuitry of claim 16 further comprising a trigger pulse input coupled to a base of an NPN BJT of a first SCR unit.

20. The ESD protection circuitry of claim 15 wherein an Nth diode includes an anode coupled to a first node of an Nth SCR unit, and a cathode coupled to a trigger node of a first SCR unit.

* * * * *